(12) United States Patent
Tran et al.

(10) Patent No.: US 6,587,519 B1
(45) Date of Patent: Jul. 1, 2003

(54) EFFICIENT APPARATUS AND METHOD FOR GENERATING A TRELLIS CODE FROM A SHARED STATE COUNTER

(75) Inventors: Howard Tran, Downey, CA (US); Jyoti Setlur, Irvine, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/322,703

(22) Filed: May 28, 1999

(51) Int. Cl.$^7$ ................................................ H03D 1/00
(52) U.S. Cl. ...................................................... 375/341
(58) Field of Search ................................. 375/316, 341, 375/262, 265; 714/795, 794, 759, 781, 791; 370/320, 335, 342, 441

(56) References Cited

U.S. PATENT DOCUMENTS

| | | | | |
|---|---|---|---|---|
| 5,862,190 A | * | 1/1999 | Schaffner | 375/341 |
| 5,878,098 A | * | 3/1999 | Wang et al. | 375/377 |
| 5,991,343 A | * | 11/1999 | Oh et al. | 375/341 |
| 5,996,112 A | * | 11/1999 | Dabiri et al. | 714/795 |
| 6,189,126 B1 | * | 2/2001 | Ulmer et al. | 714/795 |
| 6,222,889 B1 | * | 4/2001 | Lee | 375/265 |
| 6,477,680 B2 | * | 11/2002 | Mujtaba | 714/795 |

\* cited by examiner

*Primary Examiner*—Emmanuel Bayard
(74) *Attorney, Agent, or Firm*—Peter Zawilski

(57) ABSTRACT

An apparatus and method thereof for decoding a stream of binary digits encoded according to a convolutional code. The apparatus includes a bus, a N-bit counter coupled to the bus, and a trellis code generator coupled to the bit counter. The bit counter is adapted to generate a sequence of N binary bits. The trellis code generator includes a first logical gate and a second logical gate. The trellis code generator is adapted to specify a first set of binary digits from the sequence of N binary bits and to pass the first set of binary digits through the first logical gate to produce a first binary value. The trellis code generator is also adapted to specify a second set of binary digits from the sequence of N bits and to pass the second set of binary digits through the second logical gate to produce a second binary value. The first set of binary digits are particularly specified so that the first binary value emulates a first value of a first encoded bit that would have been determined using the convolutional code. Similarly, the second set of binary digits is specified so that the second binary value emulates a first value of a second encoded bit that would have been determined using the convolutional code. Thus, the apparatus is used to efficiently generate a trellis representing the convolutional code.

21 Claims, 8 Drawing Sheets

| METRIC MEMORY A 360a |
|---|
| 0 |
| 1 |
| 2 |
| ••• |
| ((2\*\*N)/2)-1 |
| (2\*\*N)/2 |

| METRIC MEMORY B 360b |
|---|
| 0 |
| 1 |
| 2 |
| ••• |
| ((2\*\*N)/2)-1 |
| (2\*\*N)/2 |

Figure 6

EFFICIENT APPARATUS AND METHOD FOR GENERATING A TRELLIS CODE FROM A SHARED STATE COUNTER

TECHNICAL FIELD

The present invention pertains to the field of wireless communication technology. More specifically, the present invention pertains to decoding signals received by a receiver in a wireless communication system.

BACKGROUND ART

Wireless telephony has become a widely available mode of communication in modem society. Variable rate communication systems, such as Code Division Multiple Access (CDMA) spread spectrum systems, are among the most commonly deployed wireless technology. Variable rate communication systems transmit data in units called data frames.

CDMA utilizes digital encoding for every telephone call or data transmission in order to provide privacy and security. Unique codes are assigned to every communication, which distinguish it from the multitude of calls simultaneously transmitted over the same broadcast spectrum. Users share time and frequency allocations and are channelized by unique assigned codes. The signals are separated at the receiver in a known manner so that the receiver accepts only signals from the desired channel.

Some CDMA spread spectrum systems use a form of direct sequence in which, in essence, a communication waveform is modified by a pseudonoise binary sequence in the transmitter. A second modification by a replica of the pseudonoise binary sequence occurs in the receiver to recover the original signal. Generally, within a CDMA environment with a large number of users on the system, a high level of channel noise is usually present. In particular, each user is a source of noise to every other user on the same system. Undesired signals also contribute to the noise. Noise and interference, being uncorrelated with the pseudonoise binary sequence, add an element to the signal that needs to be considered when recovering the original signal.

Convolutional codes are known in the art and are used by the transmitter to encode a stream of binary digits. Typically, a convolutional encoder consists of a N-stage shift register and modulo-2 adders. Each digit of the digit stream is input into the shift register, and the convolutional code generates output digits that are an encoded version of the each input digit. For example, if the coding rate is 1/2, two output digits are generated for each input digit. A convolutional code is often represented in a known fashion using a trellis that shows the coded output for any possible sequence of input digits.

At the receiver, various techniques are known in the art for decoding a digital stream encoded using convolutional codes. The coding polynomial used in the convolutional code utilized by the transmitter is specified for the receiver, and so the receiver is able to decode the transmitted signal to determine expected values. However, due to the introduction of noise and interference during transmission, the received signal is likely to be different from the transmitted signal. A Viterbi decoder provides a well-known method to correct for errors introduced by noise and interference to determine decoded values based on the received signal. In essence, a Viterbi decoder determines the path through the convolutional code trellis that results in the sequence of digits that agrees most with the received sequence.

In the prior art, the expected values are calculated beforehand using the specified convolutional code and stored as a lookup table in, for example, a read-only memory (ROM). However, a disadvantage to the prior art is that the ROM occupies valuable physical space inside the receiver. Consumer preferences are for receivers to be as small and light as possible, and the need for ROM is contrary to these preferences.

Also, retrieving a value from ROM consumes battery power, and so larger and heavier batteries are required; otherwise, more frequent charging of the batteries is needed. However, this is also contrary to consumer preferences for smaller and lighter receivers, and it is also problematic because it likely increases the cost of the receiver.

In addition, retrieving a value from ROM consumes processing power, and so larger and more complex processors are required if a performance level acceptable to consumers is to be maintained. However, such processors are typically also more expensive, again contrary to consumer preferences for less costly receivers.

Accordingly, what is needed is an apparatus that cheaply and efficiently implements a technique for decoding a digital stream encoded using convolutional codes. What is also needed is an apparatus that addresses the above need and minimizes consumption of space, processing power, and battery power in a receiver. The present invention provides a novel solution to the above needs.

These and other objects and advantages of the present invention will become obvious to those of ordinary skill in the art after having read the following detailed description of the preferred embodiments which are illustrated in the various drawing figures.

DISCLOSURE OF THE INVENTION

The present invention provides an apparatus and method thereof that cheaply and efficiently implement a technique for decoding a digital stream encoded using convolutional codes. The present invention also provides an apparatus and method thereof that address the above need and minimize consumption of space, processing power, and battery power in a receiver.

The present embodiment of the present invention pertains to an apparatus and method thereof for decoding a stream of binary digits encoded according to a convolutional code. In a preferred embodiment, the apparatus is disposed within a receiver used in a communication system, in particular a communication system that uses code division multiple access (CDMA) spread spectrum type communication signals.

In the present embodiment of the present invention, the apparatus includes a bus, a N-bit counter coupled to the bus, and a trellis code generator coupled to the bit counter. The N-bit counter is adapted to generate a sequence of N binary bits (e.g., an initial state count). The trellis code generator includes a first logical gate and a second logical gate. The trellis code generator is adapted to specify a first set of binary digits from the sequence of N binary bits and to pass the first set of binary digits through the first logical gate to produce a first binary value. The trellis code generator is also adapted to specify a second set of binary digits from the sequence of N bits and to pass the second set of binary digits through the second logical gate to produce a second binary value. The first set of binary digits are particularly selected so that the first binary value emulates a first value of a first encoded bit that would have been determined using the convolutional code. Similarly, the second set of binary digits is selected so that the second binary value emulates a first value of a second encoded bit that would have been determined using the convolutional code. Thus, the apparatus is used to efficiently generate a trellis representing the convolutional code using logical gates.

In the present embodiment, the trellis code generator further comprises a first inverter for inverting the first binary value to produce a third binary value, and a second inverter adapted to invert the second binary value to produce a fourth binary value, wherein the third binary value emulates a second value of the first encoded bit that would have been determined using the convolutional code and the fourth binary value emulates a second value of the second encoded bit that would have been determined using the convolutional code.

In one embodiment, the trellis code generator is adapted to manipulate the sequence of N binary digits to generate a modified state count. The modified state count is used to generate the trellis representing the convolutional code.

In one embodiment, the apparatus includes a Viterbi decoder adapted to compute metrics by comparing the first binary value and the second binary value to the first encoded bit and the second encoded bit. The Viterbi decoder is further adapted to perform a traceback operation.

In this embodiment, the Viterbi decoder includes a first memory register for storing the metrics. An address in the first memory register is generated using the modified state count from the trellis code generator. The Viterbi decoder also comprises a second memory register for storing information for the traceback operation. An address in the second memory register is also generated using the modified state count trellis code generator. Thus, in accordance with the present embodiment of the present invention, the modified state count is used for generating a trellis representing a convolutional code, for addressing metric memory, and for addressing traceback memory.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 6 illustrates the structure of a metric memory in accordance with one embodiment of the present invention.

BEST MODE FOR CARRYING OUT THE INVENTION

Figure 1:
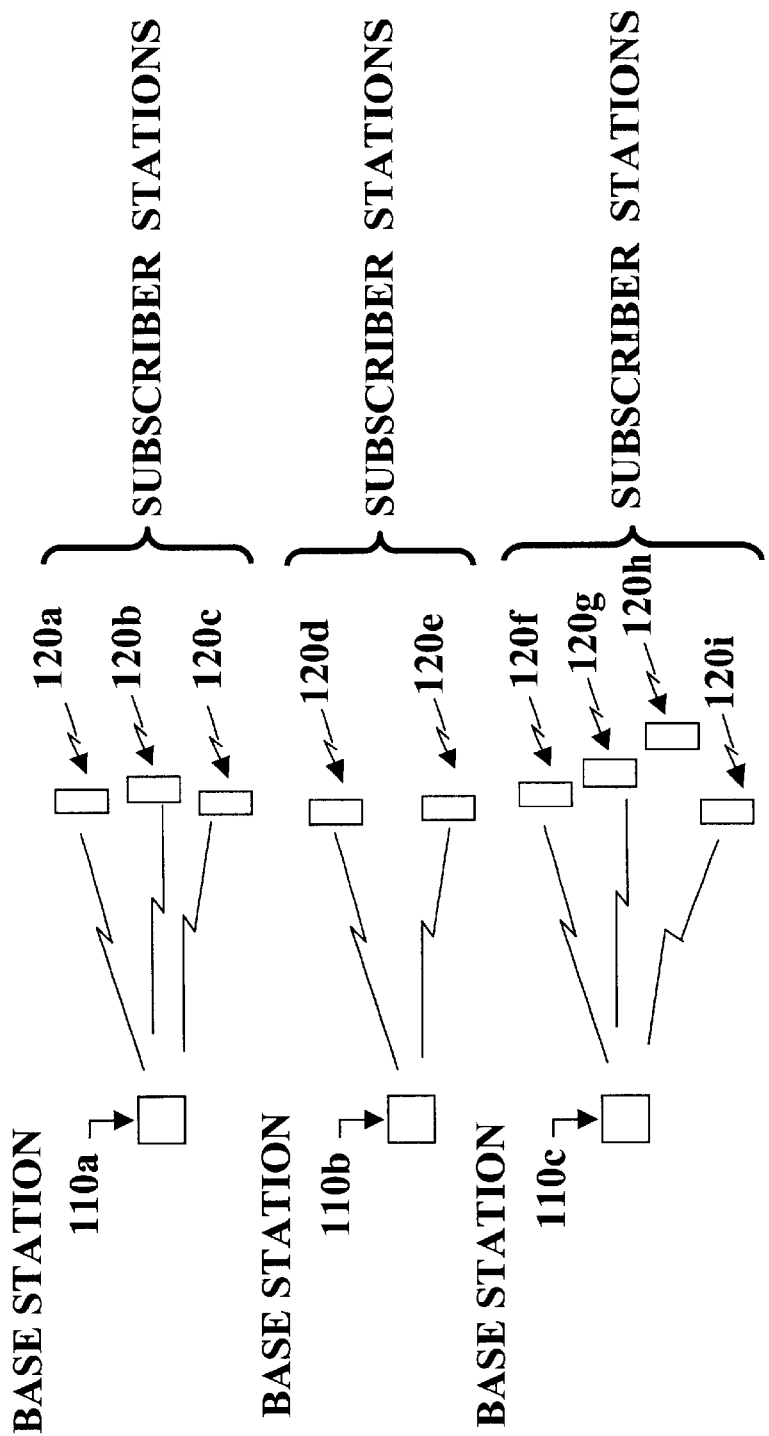
FIG. 1 provides a general overview of a wireless communication system in accordance with one embodiment of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in:the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, fragments, pixels, or the like.

As used herein, a transaction refers to the transmission or receipt of data or other such message information. The transaction may consist of all data associated with a particular computer system operation (e.g., a request or command). A transaction may also consist of a block of data associated with a particular operation; for example, a transfer of data may be broken down into several blocks of data, each block transferred prior to the transfer of a subsequent block, and each block making up a transaction.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "inputting," "specifying," "passing," "generating," "inverting" or the like, refer to actions and processes of a computer system or similar electronic computing device. The computer system or similar electronic computing device manipulates and transforms data represented as physical (electronic) quantities within the computer system memories, registers or other such information storage, transmission or display devices. The present invention is well suited to the use of other computer systems.

The present invention is discussed in the context of a wireless communication system, in particular a system that uses code division multiple access (CDMA) spread spectrum type communication signals. In a preferred embodiment, the present invention is implemented in a receiver used in a wireless communication system. However, it is understood that other applications and implementations may be used in accordance with the present invention.

FIG. 1 provides a general overview of a wireless communication system 100 in accordance with one embodiment of the present invention. Communication system 100 consists of a family of base stations 110a, 110b and 110c (e.g., cells) that are geographically distributed over the service area. Communication system 100 also includes a plurality of subscriber stations (e.g., receivers 120a–120i). Communication system can be coupled to a standard telephone wire system (not shown). In the present embodiment, communication system 100 uses CDMA spread spectrum type communication signals, although it is appreciated that other applications using different communication technologies can be used in accordance with the present invention.

Each of receivers 120a–120i is exemplified as a mobile station such as a personal cordless telephone, a pager, or a computer system with a wireless modem; however, a subscriber station may also be in a relatively fixed location, such as a standard computer system with a wireless modem or the like.

Communication is established between a base station (e.g., base station 110a) and a subscriber station (e.g., receiver 120a) using well-known techniques. Once communication is established, movement of receiver 120a is detected and service is handed over from one base station to another.

Figure 2:
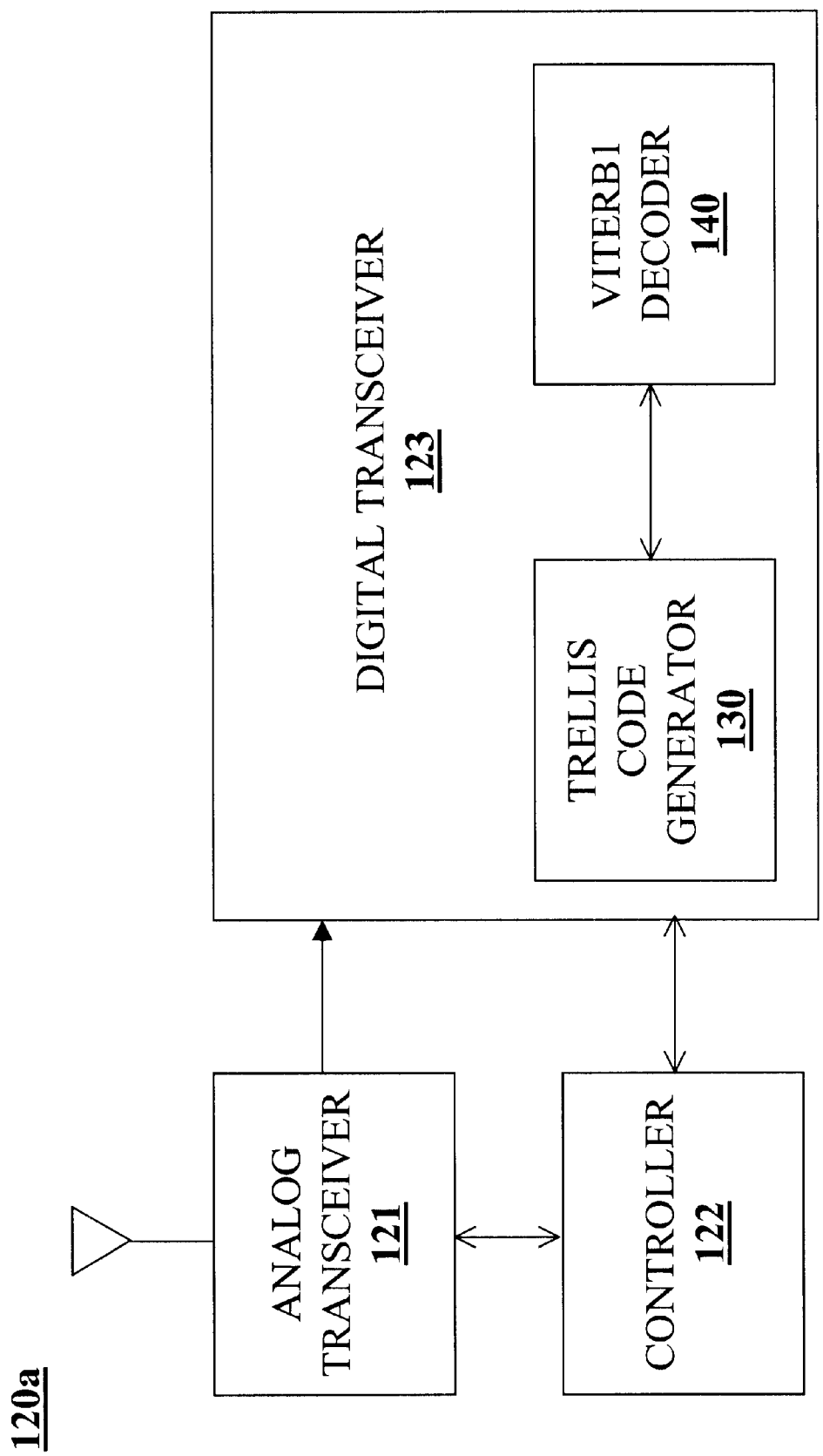
FIG. 2 illustrates the primary functional blocks in an exemplary subscriber station in a wireless communication system in accordance with one embodiment of the present invention.

FIG. 2 illustrates the primary functional blocks in a subscriber station such as that exemplified by receiver 120a in accordance with one embodiment of the present invention. Analog transceiver 121 is used, for example, to receive the communication signal from base station 110a (FIG. 1) and convert it from an analog signal (e.g., a radio signal) to a baseband digital signal. Controller 122 consists of, for example, the central processing unit and executes the control logic for receiver 120a. Digital transceiver 123 contains the digital data processing elements such as a demodulator and a modulator (not shown). Digital transceiver 123 also contains Viterbi decoder 140 including trellis code generator 130.

Figure 3:
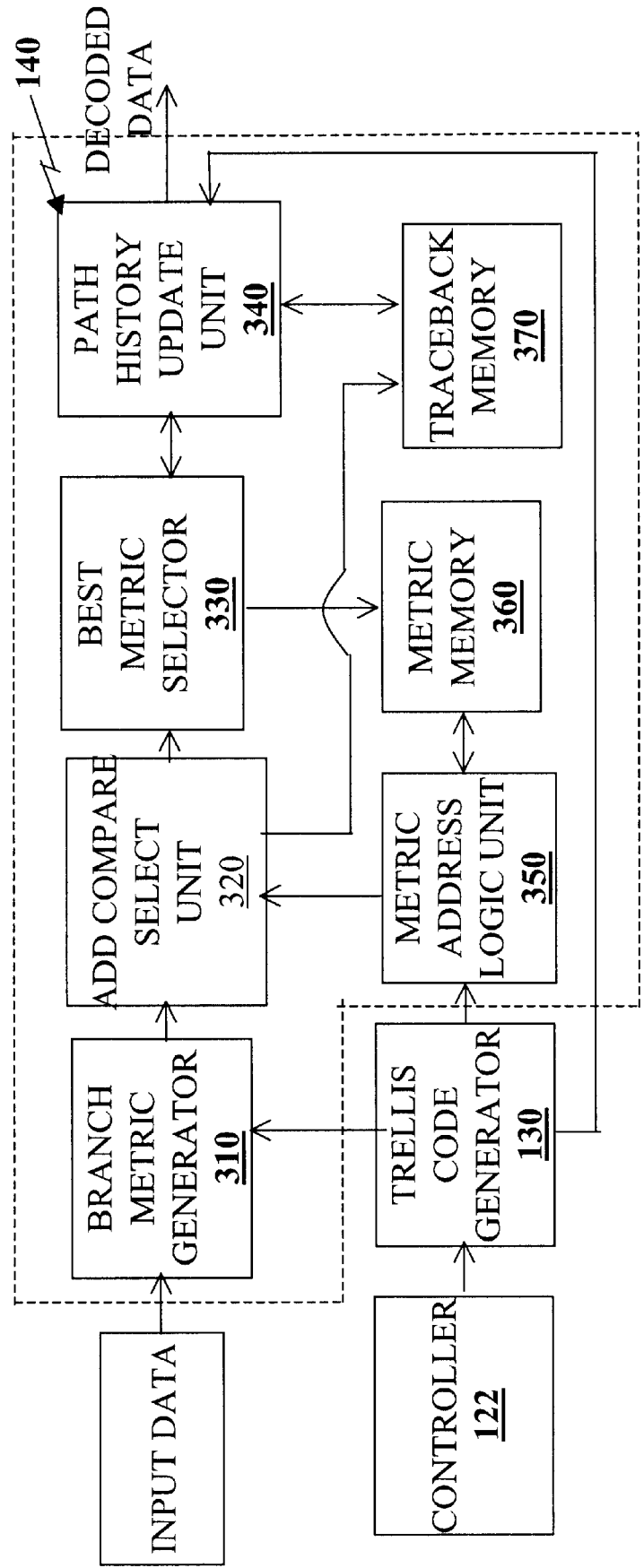
FIG. 3 is a block diagram of a Viterbi decoder in accordance with one embodiment of the present invention.

FIG. 3 is a block diagram of Viterbi decoder 140 in accordance with one embodiment of the present invention. Convolutional codes are known in the art and are used by a transmitter to encode a stream of binary digits. The encoded signals are received by the receiver (e.g., receiver 120a of FIG. 2) and the encoded data are input to Viterbi decoder 140. A convolutional code is often represented in a known fashion as a trellis that shows the encoded output for any possible sequence of input digits. For each frame, Viterbi decoder 140 determines the path through the convolutional code trellis that results in the sequence of digits that agrees most with the received signals.

Viterbi decoders, their function and implementation are well-known in the art. In the present embodiment, Viterbi decoder 140 comprises trellis code generator 130, Viterbi decoder control logic unit 305, branch metric generator 310, add compare select unit 320, best metric selector 330, path history update unit 340, metric address logic unit 350, metric memory 360, and traceback memory 370, coupled by buses.

Trellis code generator 130 computes expected values of the encoded data emulating the convolutional encoder used by the transmitter. Viterbi decoder 140 (specifically, branch metric generator 310) computes a metric (such as a Hamming distance or the like) for each branch that feeds into a node ("state") in the convolutional code trellis. The metrics are computed by comparing the received signal and the expected values from trellis code generator 130. The metric for each state is stored in metric memory 360. Metric address logic unit 350 is used to generate addresses in metric memory 360 for the metrics for each state. Traceback memory 370 contains information (e.g., survivor state information) required by Viterbi decoder 140 for a traceback operation. Traceback memory 370 contains a branch indicator indicating which of the two paths into a state was chosen for that state (e.g., the survivor state). In the traceback operation, Viterbi decoder 140 determines the path through the convolutional code trellis that results in the sequence of digits that agrees most with the received sequence. At the end of the traceback operation, the decoded data bit for each signal bit received by the receiver is produced.

Figure 4:
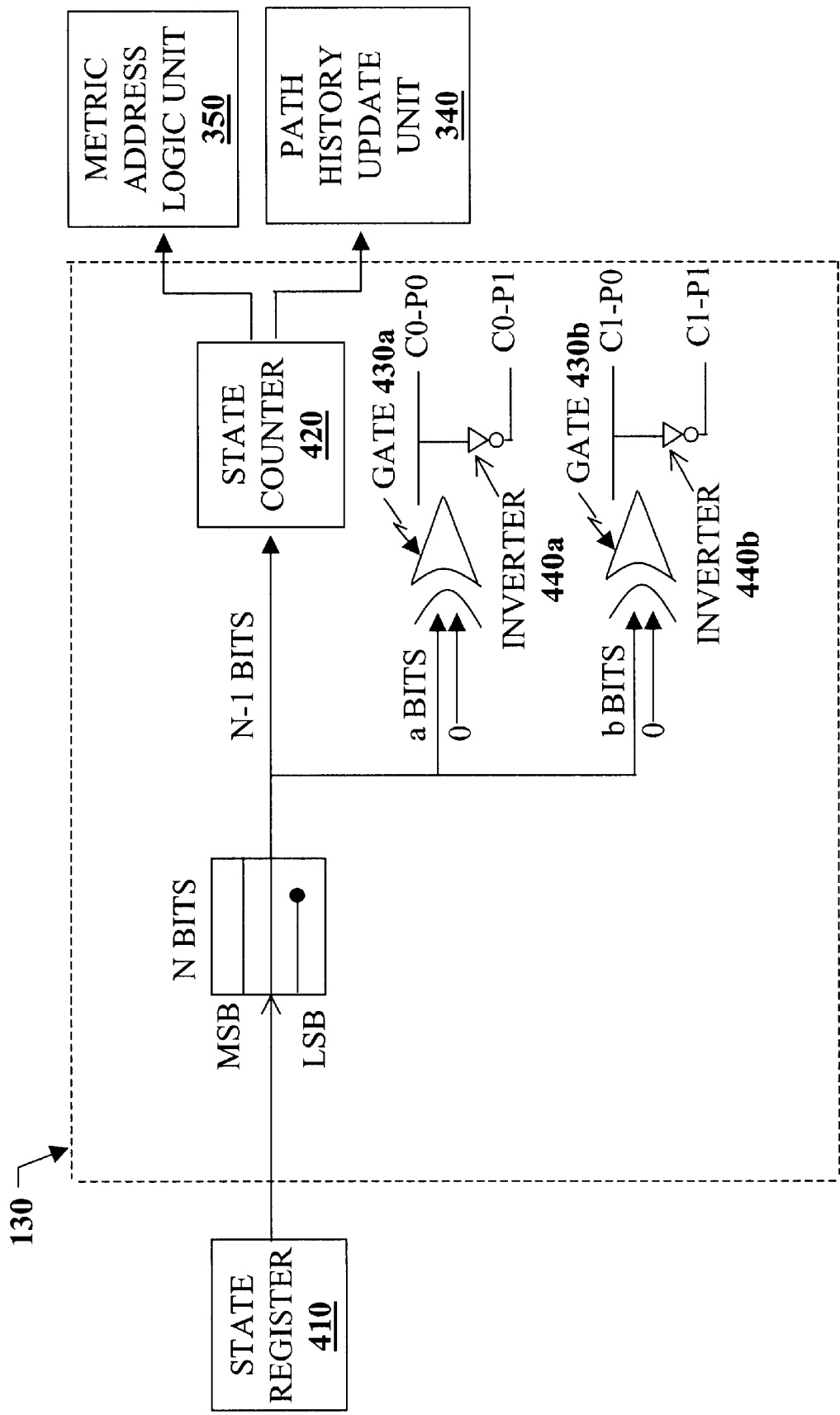
FIG. 4 illustrates the flow of data through a trellis code generator in accordance with one embodiment of the present invention.

FIG. 4 illustrates the flow of data through trellis code generator 130 in accordance with one embodiment of the present invention. Trellis code generator 130 computes the expected values that Viterbi decoder 140 (FIG. 3) compares to the received signal in order to generate branch metrics. Trellis code generator 130 is used to duplicate the convolutional code utilized by the transmitter.

Continuing with reference to FIG. 4, state counter 410 is a N-bit counter. In a preferred embodiment, N is eight (8) corresponding to a constraint length of nine (9); however, it is understood that greater or lesser number of stages and bits may be used in accordance with the present invention.

State counter 410 is implemented in Viterbi decoder control logic unit 305. State counter 410 counts through each of the possible states of N binary digits (e.g., initial state count). For each of the possible states in state counter 410, trellis code generator 130 calculates in real time the corresponding encoded values that would be calculated according to a convolutional code. That is, trellis code generator 130 duplicates the function of a convolutional encoder, and duplicates the output of a convolutional code for each given state as it is needed. As will be seen, trellis code generator 130 accomplishes this in an efficient manner using logical gates and inverters; thus, in accordance with the present invention, the need for more complex processors and/or large read-only memories (ROMs) is eliminated.

In one embodiment of the present invention, the N binary digits ("bits") produced by state counter 410 are manipulated to produce a modified state count 420. For example, a bit may be added to or removed from the N bits from state counter 410, or the bits may be rotated left or right by one or more positions. It is appreciated that other forms of bit manipulation may be utilized in accordance with the present invention. The particular form of manipulation is implementation dependent.

Hence, modified state count 420 contains a sequence of bits that is a function of the states in state counter 410 (e.g., the initial state count). Modified state count 420 is subsequently used in metric address logic unit 350 and path history update unit 340, as explained below in conjunction with FIGS. 5 and 7, respectively. Thus, in accordance with the present invention, modified state count 420 is used for each of trellis code generator 130, metric address logic unit 350, and path history update unit 340. Thus, the need is eliminated for separate counters to generate this information individually in trellis code generator 130, metric address logic 350, and path history update unit 340.

With reference still to FIG. 4, modified state count 420 can also be manipulated as described above (depending on the implementation), and then passed through gates 430a and 430b in order to calculate the corresponding encoded values that would be calculated according to a convolutional code. In the present embodiment, "a" bits are selected from modified state count 420 and passed through gate 430a, and "b" bits are selected from modified state count 420 and passed through gate 430b.

Gate 430a is an XOR gate known in the art, and is adapted to produce a single binary value depending on the combination of bits passed through the gate. The "a" bits are specifically selected so that the binary value produced by passing through gate 430a is the same as the encoded value that would be produced by a convolutional code. In this manner, trellis code generator 130 determines a first value C0-P0 of the convolutional code trellis.

In the present embodiment, the convolutional code utilized by the transmitter is symmetrical. For a symmetrical convolutional code, a second value C0-P1 of the convolutional code trellis can be determined by inverting the binary value produced by passing through gate 430a. Accordingly, inverter 440a is used to invert C0-P0 to determine C0-P1. For a convolutional code that is not symmetrical, modified state count 420 can be further manipulated and passed through another logical gate to determine C0-P1. That is, as above, modified state count 420 can be manipulated to form a sequence of bits that, when passed through a logical gate, produce a binary value that is the same as the encoded value that would be produced by a convolutional code.

In order to complete the convolutional code trellis for all states in state counter 410, further manipulation of modified state count 420 can be performed, and the resulting bits passed through a second logical gate to derive a second set of encoded values.

With reference still to FIG. 4, "b" bits are selected by manipulation modified state count 420 as described previously herein. The resulting combination of bits is passed through gate 430b. Gate 430b is an XOR gate known in the art, and is adapted to produce a single binary value depending on the combination of bits passed through the gate. The "b" bits are specifically selected so that the binary value produced by passing through gate 430b is the same as the encoded value that would be produced by a convolutional code. In this manner, trellis code generator 130 determines a value C1-P0 of the convolutional code trellis.

In the present embodiment, the convolutional code utilized by the transmitter is symmetrical. For a symmetrical convolutional code, a value C1-P1 of the convolutional code trellis can be determined by inverting the binary value produced by passing through gate 430b. Accordingly, inverter 440b is used to invert C1-P0 to determine C1-P1. For a convolutional code that is not symmetrical, modified state count 420 can be further manipulated and passed through another logical gate to determine C1-P1. That is, as above, modified state count 420 can be manipulated to form a sequence of bits that, when passed through a logical gate, produce a binary value that is the same as the encoded value that would be produced by a convolutional code.

In the present embodiment, trellis code generator 130 is illustrated for a coding rate of 1/2. However, it is appreciated that trellis code generator 130 can be adapted for other coding rates (e.g., 1/3, 1/4) by, for example, adding gates and/or inverters.

Trellis code generator 130 is implemented as described above for each state in state counter 410. In accordance with the present embodiment of the present invention, the convolutional code trellis is generated in real time. Trellis code generator 130 calculates the convolutional code trellis through bit manipulation in combination with gates and inverters. Gates and inverters are capable of creating the trellis convolutional code trellis quickly and efficiently, are cost-effective, and do not significantly consume valuable physical space, processing power, and battery power. Accordingly, the need for ROM dedicated to storing trellis values is eliminated, and it is not necessary to consume processing power and battery power to search through ROM to locate and retrieve trellis values.

In addition, as described above, modified state count 420 used in trellis code generator 130 is also used in path history update unit 340 and metric address logic unit 350, further increasing the overall efficiency of Viterbi decoder 140 (FIG. 3) and decreasing the overall complexity of Viterbi decoder 140.

An exemplary implementation in which N is four (4) is illustrated by Table 1. For N equal to 4, there are 16 possible states in state counter 410. In the present embodiment, bit 1 is removed from each state. Table 1 lists the 16 possible states in state counter 410 and the corresponding states in modified state count 420. As can be seen from Table 1, for each sequence of modified state count 420, there are two corresponding sequences of N bits in state counter 410. For example, both "0000" and "0010" correspond to "000."

TABLE 1

Exemplary State Register and State Counter Values for N = 4

| STATE COUNTER 410 VALUES | MODIFIED STATE COUNT 420 VALUES |
|---|---|
| 0000 | 000 |
| 0001 | 001 |
| 0010 | 000 |
| 0011 | 001 |
| 0100 | 010 |
| 0101 | 011 |
| 0110 | 010 |
| 0111 | 011 |
| 1000 | 100 |
| 1001 | 101 |
| 1010 | 100 |
| 1011 | 101 |
| 1100 | 110 |
| 1101 | 111 |
| 1110 | 110 |
| 1111 | 111 |

Figure 5:
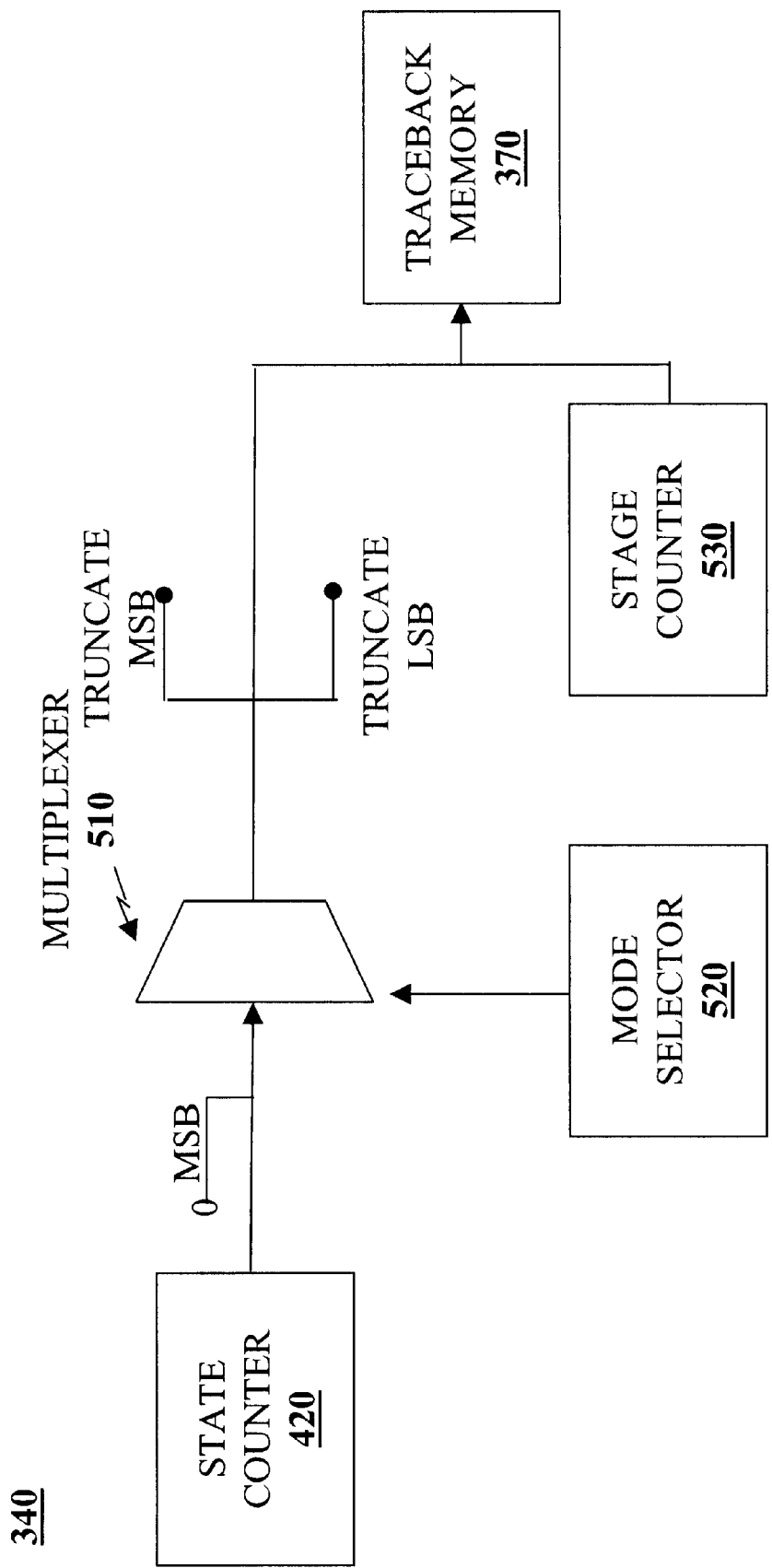
FIG. 5 illustrates the flow of data through a path history update unit in order to generate addresses for traceback memory in accordance with one embodiment of the present invention.

FIG. 5 illustrates the flow of data through path history update unit 340 in order to generate addresses for traceback memory 370 in accordance with one embodiment of the present invention. Modified state count 420 is received as input from trellis code generator 130.

With reference to FIG. 5, in the present embodiment, read and write transactions are performed with traceback memory 370. Mode selector 520 is used to indicate the type of transaction (read or write) to multiplexer 510. The address generation operation is a write operation, and thus mode selector 520 indicates this to multiplexer 510.

Each pair of encoded data signal bits received is operated on by Viterbi decoder 140. Stage counter 530 is incremented accordingly to keep a running count of the stages.

In the present embodiment, the sequence of bits from modified state count 420 pass through multiplexer 510, and the least significant bit is truncated (removed). The bits from stage counter 530 are combined with the remaining bits that originated with modified state count 420 to form an address for traceback memory 370. In this manner, a unique address is generated for each stage and for each state. For each stage, a branch indicator indicating which of the two paths into a state was chosen for that state (e.g., the survivor state) is written to traceback memory 370 and placed in the appropriate location identified by the address generated for that stage and state. The information in traceback memory 370 is subsequently used by Viterbi decoder 140 in the traceback operation to determine the path through the convolutional code trellis that results in the sequence of digits that agrees most with the received sequence.

By combining the modified state count 420 with stage counter 530 to form an address for traceback memory 370, a smaller counter is used for stage counter 530, thus reducing design complexity. Otherwise, a bigger counter is required to generate all of the address bits for traceback memory 370.

FIG. 6 illustrates the structure of metric memory 360 (FIG. 3) in accordance with one embodiment of the present invention. Metric memory 360 is separated into two registers, metric memory A 360a and metric memory B 360b. In the present embodiment, metric memory A 360a and metric memory B 360b are single port memories. In the present embodiment, metric memory A 360a and metric memory B 360b each have the same number of locations. The total number of locations in metric memory A 360a and metric memory B 360b is equal to the number of possible states of N binary digits (e.g., $2^N$). Thus, metric memory A 360a and metric memory B 360b each contain $2^N/2$ locations.

Figure 7:
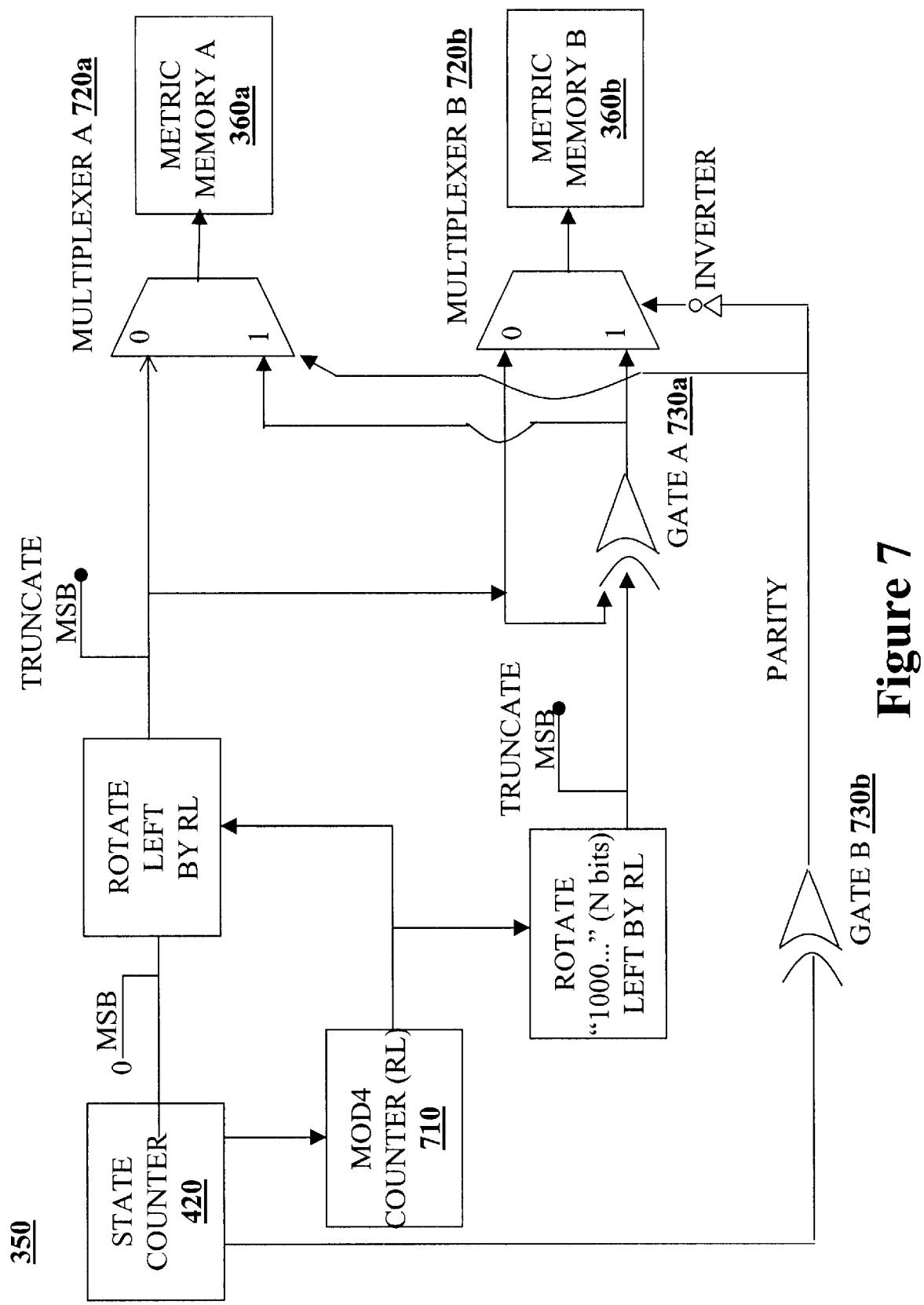
FIG. 7 illustrates the flow of data through a metric address logic unit in order to generate addresses for metric memory in accordance with one embodiment of the present invention.

FIG. 7 illustrates the flow of data through metric address logic unit 350 (FIG. 3) in order to generate addresses for metric memory 360a and metric memory 360b in accordance with one embodiment of the present invention. The addresses generated by metric address logic unit 350 are the addresses for each state in state counter 410 (FIG. 4).

Modified state count 420 is received as input from trellis code generator 130 (FIG. 4). As exemplified by Table 1, in the present embodiment each state in modified state count 420 corresponds to multiple states in state counter 410 (FIG. 4); whereas Table 1 illustrates the exemplary case of N equal to 4, it is appreciated that each modified state count corresponds to multiple states for different N. Accordingly, it is necessary to generate multiple addresses for each sequence from modified state count 420.

With reference still to FIG. 7, in a first path (e.g., a bus) through metric address logic unit 350, a value of zero (0) is added to the most significant bit (MSB) location in modified state count 420, thus forming a new sequence of bits based on modified state count 420. This new sequence of bits is rotated left by a number of rotations RL specified by MODN counter 710. For example, if RL=0, the sequence of bits is not rotated; if RL=1, then the sequence of bits is rotated left once (that is, the most significant bit is placed into the least significant bit locations, and the other bits are shifted left one place in the sequence). After the rotation occurs, the most significant bit is truncated (removed), and the remaining sequence of bits is forwarded to multiplexer A 720a and to multiplexer B 720b.

A second sequence of bits is also forwarded to multiplexer A 720a and multiplexer B 720b via a second path through metric address logic unit 350, as explained below. Based on a parity value of 0 or 1 that is also determined by metric address logic unit 350 (as explained below), one of the two sequences of bits at multiplexer A 720a is used to specify an address in metric memory A 360a. Similarly, one of the two sequences of bits at multiplexer B 720b is used to specify an address in metric memory B 360b based on the parity value.

In the second path through metric address logic unit 350, the second sequence of bits is determined by first rotating left an initial sequence of N bits by a number of rotations RL specified by MODN counter 710. The rotate left in the second path occurs at the same time as the rotate left in the first path above. The initial sequence of N bits is specified as "1000 . . . ;" that is, a value of one (1) is placed in the most significant bit location, followed by N−1 zeros. Thus, for N=4, for example, the initial sequence of bits is "1000."

Continuing in the second path, after the initial sequence of bits is rotated left by a number of rotations RL as described above, the most significant bit (MSB) is truncated and the resulting sequence of bits is forwarded to gate A 730a. Gate A 730a also receives the sequence of bits determined via the first path through metric address logic unit as described above. Gate A 730a is an XOR gate adapted to compare both sequences of N−1 bits and output a sequence of bits based on the comparison. The output from gate A 730a is forwarded to multiplexer A 720a and to multiplexer B 720b.

Thus, multiplexer A 720a receives two sequences of bits, one from the first path and one from the second path. Likewise, multiplexer B 720b also receives two sequences of bits, one from the first path and one from the second path.

Continuing with reference to FIG. 7, at multiplexer A 720a and multiplexer B 720b, a parity value is used to select one of the two sequences of bits to specify an address in metric memory A 360a and to specify an address in metric memory B 360b. In accordance with the present invention, if the selected value is zero at multiplexer A 720a, then the selected value is one at multiplexer B 720b, and vice versa. Thus, the sequence of bits selected at multiplexer A 720a will be different than the sequence of bits selected at multiplexer B 720b.

The parity value is determined via a third path through metric address logic unit 350. Modified state count 420 is forwarded to gate B 730b. Gate B 730b is an XOR gate adapted to produce a single binary value based on the sequence of bits from modified state count 420. In the present embodiment, if the sequence of bits from modified state count 420 consists of an even number of ones, or if there are no ones in the sequence, then the parity is equal to zero (0); otherwise, the parity is set to one (1). The parity value determined by gate B 730b is used to select one of the two sequences of bits at multiplexer A 720a to generate an address in metric memory A 360a. The parity value is passed through an inverter, and the inverted value is used to select one of the two sequences of bits at multiplexer B 720b to generate an address in metric memory B 360b.

In accordance with the present embodiment of the present invention, the parity value is also used to read metric data from and write metric data to metric memory A 360a and B 360b. As described above, the addresses generated by metric address logic unit 350 are the addresses for each state in state counter 410 (FIG. 4). The metric data corresponding to each state is then written to these addresses and read from these addresses. The parity value is used to align the metric data with the corresponding state location in metric memory A 360a and B 360b.

Thus, in accordance with the present embodiment of the present invention, modified state count 420 used in trellis code generator 130 is also used in path history update unit 340 and metric address logic unit 350, further increasing the overall efficiency of Viterbi decoder 140 (FIG. 3) and decreasing the overall complexity of Viterbi decoder 140.

Figure 8:
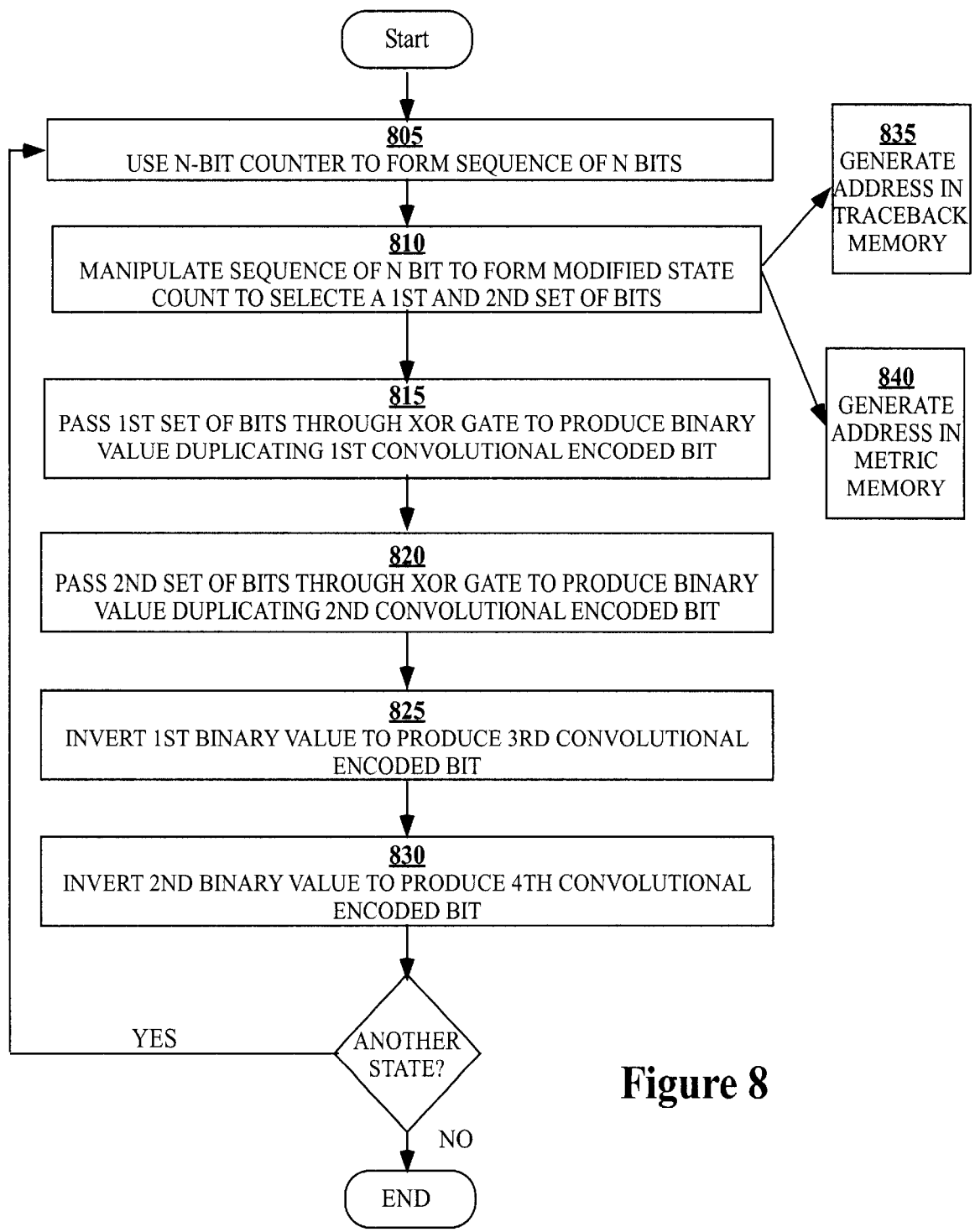
FIG. 8 is a flowchart of a process implemented by a trellis code generator and a Viterbi decoder in accordance with one embodiment of the present invention.

FIG. 8 is a flowchart of process 800 implemented by trellis code generator 130 (FIG. 4) and Viterbi decoder 140 (FIG. 3) in accordance with one embodiment of the present invention. Process 800 is repeated for each data frame received by a receiver (e.g., receiver 120a of FIG. 2).

In step 805 of FIG. 8, state counter 410 generates a sequence of N binary digits (e.g., bits). Each of the possible combinations of N bits in state counter 410 constitutes a possible state of the trellis diagram (e.g., for N=8, states 0 to 255).

In step 810 of FIG. 8, the sequence of N bits is manipulated to produce modified state count 420 (FIG. 4), which is used to specify a first set of bits and a second set of bits. The type of bit manipulation performed is implementation dependent. For example, a bit can be added or removed from the sequence of N bits, or the sequence of N bits can be rotated left or right a number of positions. It is appreciated that other forms of bit manipulation may be used in accordance with the present invention.

In step 815, the first set of bits is passed through a first logical gate. In the present embodiment, the first logical gate is an XOR gate that produces a first binary value based on the values of the bits in the first set of bits. In accordance with the present invention, the first set of bits is specified so that the first binary value duplicates the first value of the first encoded bit that would have been calculated by a convolutional encoder with an encoding rate of 1/2 (e.g., C0-P0 of FIG. 4).

In step 820, in a similar manner as step 815, the second set of bits is passed through a second logical gate to produce a second binary value. The second set of bits is also specified so that the second binary value duplicates the first value of the second encoded bit that would have been calculated by a convolutional encoder with an encoding rate of 1/2 (e.g., C1-P0 of FIG. 4).

In step 825, in the present embodiment, the binary value determined in step 815 is inverted to produce a binary value which duplicates the second value of the first encoded bit that would have been calculated by a convolutional encoder (e.g., C0-P1). It is understood that in another embodiment a gate could be used to determine the third binary value.

In step 830, in the present embodiment, the binary value determined in step 820 is inverted to produce a binary value which duplicates the second value of the second encoded bit that would have been calculated by a convolutional encoder (e.g., C1-P1). It is understood that in another embodiment a gate could be used to determine the fourth binary value.

In accordance with the present embodiment of the present invention, steps 815 through 830 are repeated for each combination of bits in modified state count 420, thereby generating a convolutional code trellis that can be used to determine expected values for received data signal bits by emulating the convolutional code used by the transmitter in order to determine the values that would have been calculated by the convolutional code.

In step 835 of FIG. 8, the modified state count from step 810 is used by path history update unit 340 to generate an address in traceback memory 370 (FIG. 5).

In step 840 of FIG. 8, the modified state count from step 810 is used by metric address logic unit 350 to generate an address in metric memory A 360a and metric memory B 360b (FIG. 7).

In summary, the present invention pertains to a trellis code generator (e.g., trellis code generator 130 of FIG. 4) that calculates the convolutional code trellis through bit manipulation in combination with gates and inverters. Gates and inverters are capable of creating the trellis convolutional code trellis quickly and efficiently, are cost-effective, and do not significantly consume valuable physical space, processing power, and battery power. Accordingly, the need for ROM dedicated to storing trellis values is eliminated, and it is not necessary to consume processing power and battery power to search through ROM to locate and retrieve trellis values.

In addition, the present invention pertains to a shared state counter (e.g., state counter 410 of FIG. 4) used by trellis code generator 130, path history update unit 340 (FIG. 5) and metric address logic unit 350 (FIG. 7).

The present invention thus provides an apparatus and method thereof that cheaply and efficiently implement a technique for decoding a digital stream encoded using a convolutional code. The present invention also thus provides an apparatus and method thereof that minimize consumption of space, processing power, and battery power in a receiver.

The preferred embodiment of the present invention, efficient apparatus and method for generating a trellis code from a shared state counter, is thus described. While the present invention has been described in particular embodiments, it should be appreciated that the present invention should not be construed as limited by such embodiments, but rather construed according to the following claims.

What is claimed is:

1. A method for decoding a stream of binary digits encoded according to a convolutional code, said method comprising:

a) using a N-bit counter to generate a sequence of N binary digits;

b) specifying a first set of binary digits and a second set of binary digits using said sequence of N binary bits;

c) passing said first set of binary digits through a first logical gate to produce a first binary value, wherein said first set of binary digits is specified so that said first binary value emulates a first value of a first encoded bit determined using said convolutional code; and d) passing said second set of binary digits through a second logical gate to produce a second binary value, wherein said second set of binary digits is specified so that said second binary value emulates a first value of a second encoded bit determined using said convolutional code;

wherein a convolution code trellis is generated by repeating said steps a)–d) for each possible combination of N binary digits.

2. The method for decoding a stream of binary digits according to a convolutional code as recited claim 1 wherein said step c) further comprises:

inverting said first binary value to produce a third binary value, wherein said third binary value emulates a second value of said first encoded bit determined using said convolutional code.

3. The method for decoding a stream of binary digits according to a convolutional code as recited claim 1 wherein said step d) further comprises:

inverting said second binary value to produce a third binary value, wherein said third binary value emulates a second value of said second encoded bit determined using said convolutional code.

4. The method for decoding a stream of binary digits according to a convolutional code as recited claim 1 further comprising the steps of:

specifying a third set of binary digits using said sequence of N binary digits;

passing said third set of binary digits through a third logical gate to produce a third binary value, wherein said third set of binary digits are specified so that said third binary value emulates a second value of said first encoded bit determined using said convolutional code;

specifying a fourth set of binary digits using said sequence of N binary digits; and passing said fourth set of binary digits through a fourth logical gate to produce a fourth binary value, wherein said fourth set of binary digits are specified so that said fourth binary value emulates a second value of said second encoded bit determined using said convolutional code.

5. The method for decoding a stream of binary digits according to a convolutional code as recited claim 1 wherein said method is implemented in a receiver used in a communication system.

6. The method for decoding a stream of binary digits according to a convolutional code as recited claim 5 wherein said communication system uses code division multiple access (CDMA) spread spectrum type communication signals.

7. The method for decoding a stream of binary digits according to a convolutional code as recited claim 1 further comprising the steps of:

e1) computing metrics using a Viterbi decoder to compare said first binary value and said second binary value to said first encoded bit and said second encoded bit; and e2) generating an address in a first memory register using said sequence of N binary digits, wherein said first memory register is used to store said metrics.

8. The method for decoding a stream of binary digits according to a convolutional code as recited claim 7 further comprising the step of:

e3) generating an address in a second memory register using said sequence of N binary digits, wherein said second memory register is used to store information required by said Viterbi decoder for a traceback operation.

9. An apparatus for decoding a stream of binary digits encoded according to a convolutional code, said apparatus comprising:

a bus;

a N-bit counter coupled to said bus, said N-bit counter adapted to generate a sequence of N binary bits; and a trellis code generator coupled to said N-bit counter, said trellis code generator comprising a first logical gate and a second logical gate;

said trellis code generator adapted to specify a first set of binary digit from said sequence of N binary bits and to pass said first set of binary digits through said first logical gate to produce a first binary value, wherein said first set of binary digits is specified so that said first binary value emulates a first value of a first encoded bit determined using said convolutional code;

said trellis code generator further adapted to specify a second set of binary digits from said sequence of N bits and to pass said second set of binary digits through said second logical gate to produce a second binary value, wherein said second set of binary digits is specified so that said second binary value emulates a first value of a second encoded bit determined using said convolutional code.

10. The apparatus of claim 9 wherein said trellis code generator further comprises:

a first inverter for inverting said first binary value to produce a third binary value; and a second inverter adapted to invert said second binary value to produce a fourth binary value;

wherein said third binary value emulates a second value of said first encoded bit determined using said convolutional code and said fourth binary value emulates a second value of said second encoded bit determined using said convolutional code.

11. The apparatus of claim 9 wherein said trellis code generator further comprises a third logical gate and a fourth logical gate;

said trellis code generator adapted to specify a third set of binary digits and to pass said third set of binary digits through said third logical gate to produce a third binary value, wherein said third set of binary digits is specified so that said third binary value emulates a second value of said first encoded bit determined using said convolutional code;

said trellis code generator further adapted to specify a fourth set of binary digits and to pass said fourth set of binary digits through said fourth logical gate to produce a fourth binary value, wherein said fourth set of binary digits is specified so that said fourth binary value emulates a second value of said second encoded bit determined using said convolutional code.

12. The apparatus of claim 9 wherein said apparatus is disposed within a receiver used in a communication system.

13. The apparatus of claim 12 wherein said communication system uses code division multiple access (CDMA) spread spectrum type communication signals.

14. The apparatus of claim 9 further comprising:

a Viterbi decoder adapted to compute metrics by comparing said first binary value and said second binary value to said first encoded bit and said second encoded bit, said Viterbi decoder further adapted to perform a traceback operation.

15. The apparatus of claim 14 wherein said Viterbi decoder comprises a first memory register for storing said metrics, wherein an address in said first memory register is generated using said sequence of N binary digits.

16. The apparatus of claim 15 wherein said Viterbi decoder comprises a second memory register for storing information for said traceback operation, wherein an address in said second memory register is generated using said sequence of N binary digits.

17. In a receiver used in a communication system, an apparatus for decoding a stream of binary bits encoded according to a convolutional code, said apparatus comprising:

a bus;

a N-bit counter coupled to said bus, said N-bit counter adapted to generate a sequence of N binary bits;

a trellis code generator coupled to said N-bit counter; and a Viterbi decoder coupled to said N-bit counter, said Viterbi decoder adapted to compute metrics for encoded bits received by said receiver and to perform a traceback operation;

said Viterbi decoder further comprising:

a first memory register for storing said metrics, wherein an address in said first memory register is generated using said sequence of N binary digits; and a second memory register for storing information for said traceback operation, wherein an address in said second memory register is generated using said sequence of N binary digits.

18. The apparatus of claim 17 wherein said trellis code generator is adapted to specify a first set of binary digits from said sequence of N binary bits and to pass said first set of binary digits through a first logical gate to produce a first binary value, wherein said first set of binary digits is specified so that said first binary value emulates a first value of a first encoded bit determined using said convolutional code; and said trellis code generator is further adapted to specify a second set of binary digits from said sequence of N bits and to pass said second set of binary digits through a second logical gate to produce a second binary value, wherein said second set of binary digits is specified so that said second binary value emulates a first value of a second encoded bit determined using said convolutional code.

19. The apparatus of claim 18 wherein said trellis code generator further comprises:

a first inverter for inverting said first binary value to produce a third binary value; and a second inverter adapted to invert said second binary value to produce a fourth binary value;

wherein said third binary value emulates a second value of said first encoded bit determined using said convolutional code and said fourth binary value emulates a second value of said second encoded bit determined using said convolutional code.

20. The apparatus of claim 18 wherein said trellis code generator further comprises:

a third logical gate; and a fourth logical gate;

said trellis code generator adapted to specify a third set of binary digits and to pass said third set of binary digits through said third logical gate to produce a third binary value, wherein said third set of binary digits is specified so that said third binary value emulates a second value of said first encoded bit determined using said convolutional code;

said trellis code generator further adapted to specify a fourth set of binary digits and to pass said fourth set of binary digits through said fourth logical gate to produce a fourth binary value, wherein said fourth set of binary digits is specified so that said fourth binary value emulates a second value of said second encoded bit determined using said convolutional code.

21. The apparatus of claim 17 wherein said communication system uses code division multiple access (CDMA) spread spectrum type communication signals.

* * * * *